US007728406B2

(12) United States Patent  
Ido et al.

(10) Patent No.: US 7,728,406 B2  
(45) Date of Patent: Jun. 1, 2010

(54) SEMICONDUCTOR DEVICE

(75) Inventors: Yasuhiro Ido, Tokyo (JP); Takeshi Iwamoto, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 581 days.

(21) Appl. No.: 11/584,513

(22) Filed: Oct. 23, 2006

(65) Prior Publication Data

US 2007/0102786 A1 May 10, 2007

(30) Foreign Application Priority Data

Nov. 10, 2005 (JP) .............................. 2005-326629

(51) Int. Cl.
*H01L 29/00* (2006.01)
(52) U.S. Cl. .................. 257/529; 257/209; 257/665; 257/E21.529; 257/E21.596; 257/E23.15
(58) Field of Classification Search .............. 257/209, 257/529, 665
See application file for complete search history.

(56) References Cited

U.S. PATENT DOCUMENTS 6,867,441 B1 * 3/2005 Yang et al. ................. 257/209

6,927,100 B2 * 8/2005 Ema ........................... 438/132
2003/0015798 A1 * 1/2003 Haruhana et al. ............ 257/758
2003/0173597 A1 * 9/2003 Kamiya ...................... 257/209
2007/0018279 A1 * 1/2007 Lin et al. .................... 257/529
2008/0081454 A1 * 4/2008 Sakoh ........................ 438/601
2008/0286964 A1 * 11/2008 Hotta et al. ................. 438/637

FOREIGN PATENT DOCUMENTS

| JP | 8-321549 | * 12/1996 |
| JP | 2002-134616 A | 5/2002 |
| JP | 2006-73891 | * 3/2006 |

* cited by examiner

*Primary Examiner*—A. Sefer
(74) *Attorney, Agent, or Firm*—Buchanan Ingersoll & Rooney PC

(57) ABSTRACT

A semiconductor device of the present invention comprises: a substrate; a plurality of wiring layers formed over the substrate; a fuse formed in an uppermost one of the plurality of wiring layers; a first insulating film made up of a single film and formed on the uppermost wiring layer such that the first insulating film is in contact with a surface of the fuse; and a second insulating film formed on the first insulating film; wherein the second insulating film has an opening therein formed above a fuse region of the uppermost wiring layer such that only the first insulating film exists above the fuse region, the fuse region including the fuse and being irradiated with a laser beam when the fuse is blown.

9 Claims, 15 Drawing Sheets d1 : 0.2 μm
d2 : 0.07 μm
d3 : 0.6 μm

SEMICONDUCTOR DEVICE

BACKGROUND OF THE INVENTION

1. Field of the Invention

The present invention relates to a semiconductor device, and more particularly to a semiconductor device that includes redundant circuitry including fuses.

2. Background Art

In recent years, semiconductor devices have been miniaturized and increased in capacity and speed, resulting in an increase in the number of devices, or elements, formed therein. This has increased the influence of the defective device portions on the manufacturing yield of the semiconductor devices. Therefore, to prevent a reduction in the yield of semiconductor devices due to their defective device portions, many semiconductor devices have a redundant circuit configuration in which a plurality of spare (or redundant) memory cells are provided separately from the memory cells in the normal memory regions. With this arrangement, if a memory cell is found to include a defective element, this cell is replaced by a spare memory cell to salvage the semiconductor device and thereby ensure high manufacturing yield of the device.

One widely used method for replacing a memory cell including a defective element by a spare memory cell is laser trimming. In laser trimming, a wiring layer(s) functioning as fuses is cut off, or blown, by a laser beam according to a predetermined code to replace a defective memory cell by a spare memory cell. To prevent fuse blow defects in a laser trimming process, a method for blowing a fuse is proposed which applies a plurality of different wavelength laser beams to fuse wiring having a multilayer structure (see, e.g., Japanese Laid-Open Patent Publication No. 2002-134616).

However, when a fuse is blown by laser trimming using a laser beam, the applied beam may affect layers under the fuse or regions around it. Therefore, if these layers and regions include wiring such as signal wiring and power supply wiring and devices such as transistors, these wirings or these devices may be damaged when the fuse is blown. To avoid this, a semiconductor device may be configured such that the regions right under fuses and regions therearound have no devices other than fuses formed therein. However, this prevents the miniaturization of the semiconductor device.

In a semiconductor device having a multilayer structure, a number of thin interlayer films are stacked upon one another. This means that a plurality of insulating films are formed in layers over the fuses. Naturally, this insulating film stack on the fuses includes all variations in the etching and in the forming processes of each insulating film. Therefore, it is difficult to limit the variation in the thickness of the film stack across the wafer surface or between lots to 200 nm or less.

On the other hand, when a fuse having a small film thickness is blown, the upward force of the blow is small. In such a case, the opening formed by the fuse blow is large, which may have an adverse affect upon adjacent fuses or devices. Therefore, to reduce the size of the opening formed by the fuse blow, the fuse must have a sufficient film thickness. As a result, the range of allowable thicknesses of the insulating film stack on the fuse is limited. For example, when the thickness of the fuse is 250 nm, the insulating film stack on the fuse must have a thickness of approximately 200 nm or less.

However, it is difficult to reduce the variation in the thickness of the insulating film stack on the fuses to 200 nm or less, as described above. Therefore, if the thickness of the insulating film stack is set to 200 nm or less, the surface of the fuses may be exposed where the thickness variation is at its maximum (that is, 200 nm), which is not desirable since such a situation can lead to an unreliable fuse blow.

SUMMARY OF THE INVENTION

Therefore, the present invention has been devised to solve the above problems. It is, therefore, an object of the present invention to provide a miniaturized semiconductor device adapted to allow reliable laser trimming, and a manufacturing method therefor.

According to one aspect of the present invention, semiconductor device comprises a substrate, and a plurality of wiring layers formed over the substrate and constituting a wiring layer stack. The semiconductor device further comprises a fuse and a first insulating film and second insulating film. The fuse is formed in an uppermost one of the plurality of wiring layers. The first insulating film is made up of a single film and is formed on the uppermost wiring layer such as to be in contact with a surface of the fuse. The second insulating film is formed on the first insulating film and has an opening therein formed above a fuse region of the uppermost wiring layer such that only the first insulating film exists above the fuse region, the fuse region including the fuse and being irradiated with a laser beam when the fuse is blown.

Other and further objects, features and advantages of the invention will appear more fully from the following description.

DETAILED DESCRIPTION OF THE PREFERRED EMBODIMENTS

Preferred embodiments of the present invention will be described with reference to the accompanying drawings. It should be noted that in these figures, like numerals are used to denote like or corresponding components to avoid undue repetition. In the following description of preferred embodiments, details are set forth, such as specific configurations, process steps, quantities, amounts, ranges, etc. in order to provide a thorough understanding of the present invention. It is to be understood, however, that these specific details should not be construed as restrictive unless explicitly so stated or so dictated by a principle.

First Embodiment

Figure 1:
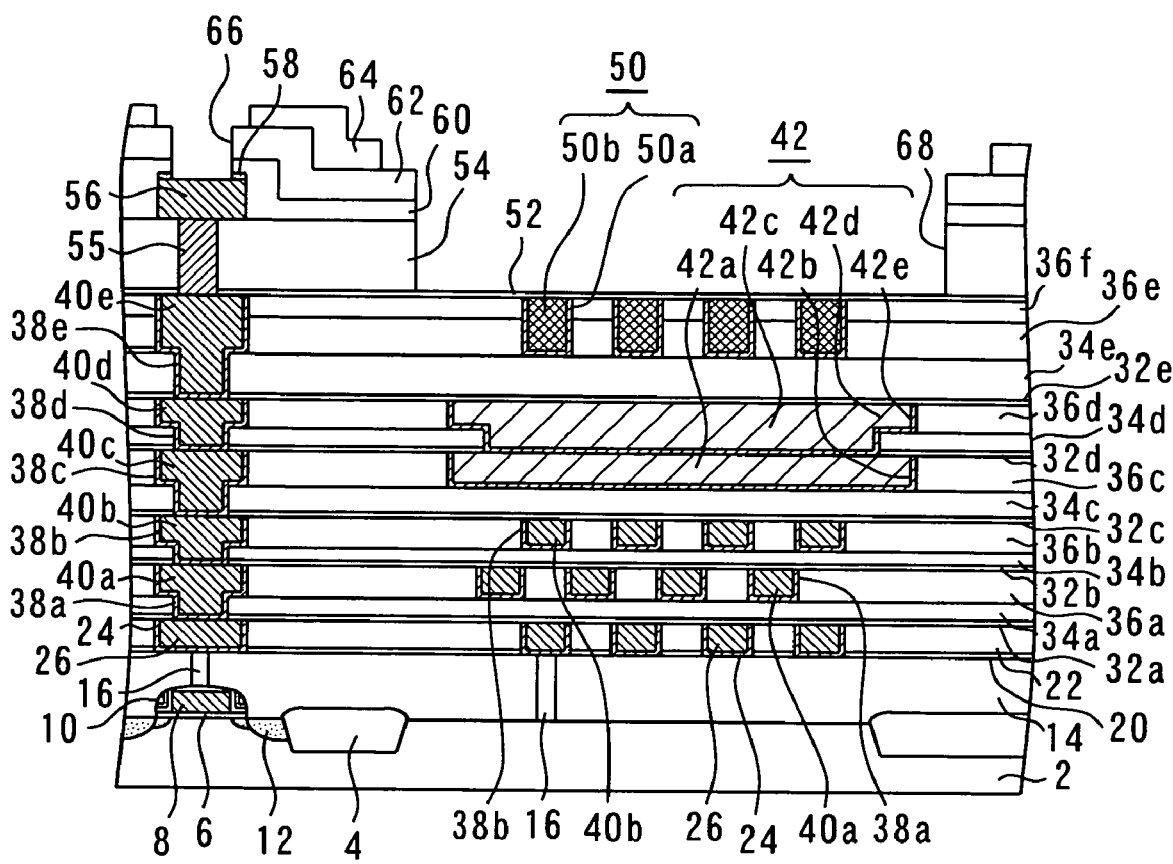
FIG. 1 is a schematic diagram illustrating a semiconductor device according to a first embodiment of the present invention.

FIG. 1 is a schematic diagram illustrating a semiconductor device according to a first embodiment of the present invention. Specifically, FIG. 1 schematically shows each wiring region and each fuse forming region of the semiconductor device. Normal wiring is formed in the wiring region, while the fuse forming region includes a region in which fuses are formed and regions over and under the fuses.

The semiconductor device shown in FIG. 1 includes an Si substrate 2 as a base layer. Trench isolation regions (or device isolation regions) 4 are formed in the Si substrate 2, and wells (not shown), etc. are formed in each region isolated by these trench isolation regions 4. As cross-sectionally shown in FIG. 1, a gate electrode 8 is formed on the Si substrate 2 with a gate insulating film 6 therebetween. Sidewalls 10 are formed on the gate insulating film 6 on both sides of the gate electrode 8. Impurity diffusion layers 12 (for source, drain, and extension regions) are formed in the surface area of the Si substrate 2 on both side of the gate electrode 8. A PTEOS film 14 is formed on the Si substrate 12 so as to cover the gate electrode 8, etc. The PTEOS film 14 is formed by plasma chemical vapor deposition (p-CVD) using TEOS (tetraethyl orthosilicate). Contact plugs 16 are formed such that they penetrate the PTEOS film 14 to form a connection with the gate electrode 8 or the surface of the Si substrate 2.

A first wiring layer is formed on the PTEOS film 14. An SiCO/SiCN film 20 made up of layers of SiCO and SiCN is formed in the first wiring layer, and a PTEOS film 22 is formed on the SiCO/SiCN film 20. Wires each made up of a barrier metal 24 and a Cu layer 26 are formed which penetrate through the SiCO/SiCN film 20 and the PTEOS film 22.

A second wiring layer is formed on the PTEOS film 22. An SiCO/SiCN film 32a, an SiOC film 34a, and an SiOC 36a are laminated to one another within the second wiring layer in that order. Further within the second wiring layer, wires each made up of a barrier metal 38a and a Cu layer 40a are formed so as to penetrate the SiCO/SiCN film 32a, the SiOC film 34a, and the SiOC film 36a, or the SiOC film 36a alone, at predetermined positions.

Likewise, a third wiring layer is formed on the SiOC film 36a of the second wiring layer. An SiCO/SiCN film 32b, an SiOC film 34b, and an SiOC film 36b are laminated to one another within the third wiring layer in that order. Further within the third wiring layer, wires each made up of a barrier metal 38b and a Cu layer 40b are formed so as to penetrate the SiCO/SiCN film 32b, the SiOC film 34b, and the SiOC film 36b, or the SiOC film 36b alone.

Further, a fourth wiring layer is formed on the SiOC film 36b of the third wiring layer. An SiCO/SiCN film 32c, an SiOC film 34c, and an SiOC film 36c are laminated to one another within the fourth wiring layer in that order. Further within the fourth wiring layer, a wire made up of a barrier metal 38c and a Cu layer 40c is formed so as to penetrate the wiring regions of the SiCO/SiCN film 32c, the SiOC film 34c, and the SiOC film 36c.

A fifth wiring layer is formed on the SiOC film 36c of the fourth wiring layer. An SiCO/SiCN film 32d, an SiOC film 34d, and an SiOC film 36d are laminated to one another within the fifth wiring layer in that order. Further within the fifth wiring layer, a wire made up of a barrier metal 38d and a Cu layer 40d is formed so as to penetrate the wiring regions of the SiCO/SiCN film 32d, the SiOC film 34d, and the SiOC film 36d.

In the fuse forming region, a Cu reflector layer 42 is formed so as to extend in the fourth wiring layer (including the films 32c, 34c, and 36c) and in the fifth wiring layer (including the films 32d, 34d, and 36d). The Cu reflector layer 42 includes a lower Cu reflector layer 42a formed so as to penetrate the SiOC film 36c of the fourth wiring layer. Specifically, the lower Cu reflector layer 42a is formed by forming a barrier metal 42b and then a Cu layer in an opening in the fuse forming region of the SiOC film 36c such that the opening is filled with the Cu layer. The barrier metal 42b prevents diffusion of Cu.

A Cu reflector connection layer 42c that penetrates through the SiCO/SiCN film 32d and the SiOC film 34d of the fifth wiring layer is connected to the top of the lower Cu reflector layer 42a. Further, an upper Cu reflector layer 42d that penetrates through the SiOC film 36d is connected with the Cu reflector connection layer 42c. The Cu reflector connection layer 42c and the upper Cu reflector layer 42d are formed by forming a barrier metal 42e and then a Cu layer in an opening (for forming Cu reflectors) in the fuse forming region of the fifth wiring layer (including the films 32d, 34d, and 36d) such that the opening is filled with the Cu layer.

A sixth wiring layer is formed on the SiOC film 36d of the fifth wiring layer. An SiCO/SiCN film 32e, an SiOC film 34e, an SiOF film 36e, and a PTEOS film 36f are laminated to one another within the sixth wiring layer in that order. Further within the sixth wiring layer, a wire made up of a barrier metal 38e and a Cu layer 40e is formed so as to penetrate the wiring regions of the SiCO/SiCN film 32e, the SiOC film 34e, the SiOF film 36e, and the PTEOS film 36f.

Further, fuses 50 are formed in the fuse forming region of the sixth wiring layer so as to penetrate the SiOF film 36e and the PTEOS film 36f. The fuses 50 are formed by forming a barrier metal 50a and then a Cu layer 50b in an opening (for forming the fuses 50) in the SiOF film 36e and the PTEOS film 36f such that the opening is filled with the Cu layer 50b. The barrier metal 50a functions to prevent diffusion of Cu. It should be noted that the thicknesses of the SiOF film 36e and the PTEOS film 36f in the fifth wiring layer are 425 nm and 75 nm, respectively, and hence the thickness of each fuse 50 is approximately 500 nm.

An SiCN film 52 is formed on the PTEOS film 36f and on the fuses 50 exposed at the surface of the PTEOS film 36f. The thickness of the SiCN film 52 is approximately 175 nm. A PTEOS film 54 is formed on the SiCN film 52. A tungsten plug 55 is formed so as to penetrate the PTEOS film 54 and the SiCN film 52 and form a connection with the wire made up of the barrier metal 38e and the Cu layer 40e. In the wiring region above the PTEOS film 54, an Al pad 56 connected to the tungsten plug 55 is formed on the PTEOS film 54. A barrier metal 58 of TiN is formed on portions of the surface of the Al pad 56. A PTEOS film 60 is laminated to the PTEO film 54, and an SiN film 62 are laminated to the PTEOS film 60. The PTEOS film 60 and the SiN film 62 act as passivation films, and the barrier metal 58 is buried under these films. A polyimide film 64 is formed on the SiN film 62 as a protective film. An opening 66 is formed in the region above the Al pad 56 so as to penetrate the barrier metal 58, the PTEOS film 60, the SiN film 62, and the polyimide film 64. The surface of the Al pad 56 is exposed at the bottom of the opening 66.

Further, in the fuse forming region above the SiCN film 52, an opening 68 is formed so as to penetrate the PTEOS film 54, the PTEOS film 60, the SiN film 62, and the polyimide film 64. That is, only the SiCN film 52 exists above the fuses 50.

Thus, the above semiconductor device is configured such that the fuses 50 are formed in the uppermost layer of the wiring layer stack, and only the SiCN film 52 is formed above the fuses 50. That is, the fuses 50 are covered with only an insulating film having a small thickness (i.e., the SiCN film 52), which reduces the size of the opening, or cavity, formed as a result of blowing a fuse 50. Further, the variation in the thickness of a single insulting film (such as the SiCN film 52) is smaller than the variation in the thickness of a film stack (such as that formed on fuses in a conventional semiconductor device). Therefore, in this semiconductor device, the scattering of the laser beam when a fuse 50 is blown can be reduced.

Thus, in the semiconductor device of the present embodiment, the fuses 50 are formed in the uppermost wiring layer (or the sixth wiring layer) so that only the SiCN film 52 exists above these fuses 50 as an insulating film. Therefore, a number of wiring layers are laminated to one another below the fuses 50, and the layer in which the fuses 50 are formed and the Si substrate 2 have a large thickness.

The components of light absorbed by a fuse when a laser beam is applied to the fuse to blow it can be broadly divided into two types: (1) those directly absorbed by the fuse after they are diffracted by the fuse and (2) those reflected to the fuse after they transmit through the fuse. Due to the nature of light, the reflected light components (2) are affected by the thickness of the insulating film(s) under the fuse through which the laser beam transmits. Therefore, if the thickness of the insulating film(s) under the fuse varies, it may degrade the reliability of a fuse blow.

In a conventional semiconductor device, in which the reflector layer 42 is not formed under the fuses, the large part of the laser beam that has transmitted through the fuse further transmits through the insulating film(s) to reach the Si substrate. Then, the large part of the laser beam is reflected from the Si substrate to the fuse. In a six-layer wiring layer structure such as that of the present embodiment, five wiring layers are formed below the fuses. In such a case, the variation in the thickness of the wiring layer stack is large, since it includes the variations in the thicknesses of all wiring layers of the layer stack. Therefore, in a conventional arrangement, the reflected light components (2) are affected by the variation in the thickness of the insulating films between the fuse and the Si substrate and hence become unstable, resulting in degraded reliability of the fuse blow.

On the other hand, in the semiconductor device of the present embodiment, the three-layer Cu reflector 42 is formed which extends in the fourth and fifth wiring layers right under the fuses 50. In this semiconductor device, most of the light that has reached the surface of the Cu reflector 42 is reflected, since, for example, the reflectance of near-infrared light incident on a Cu surface is 99% or more. This means that substantially no light transmits through the Cu reflector layer 42 and reach the underlying layers. That is, according to the present embodiment, since the Cu reflector layer 42 is disposed in the wiring layer underlying the layer in which the fuses 50 are formed, the variation in the distance between the reflection surface and the fuses 50 depends only on the variations in the thicknesses of the SiOC film 34e and the SiCO/SiCN film 32e, reducing the influence of thickness variations on the reflected light components (2). Therefore, it is possible to reduce the influence of variations in the thickness of the insulating films under the fuses 50 on a fuse blow and thereby allow a fuse to be reliably blown.

Further, the Cu reflector layer 42 is made up of three layers: the lower Cu reflector layer 42a penetrating the SiOC film 36c; the Cu reflector connection layer 42c penetrating the SiCO/SiCN film 32d and the SiOC film 34d; and the upper Cu reflector layer 42d penetrating the SiOC film 36d. Since the Cu reflector layer 42 has a three-layer structure and hence has a large thickness, the laser beam can be reliably reflected by the reflector layer 42 when a fuse 50 is blown.

Figure 2:
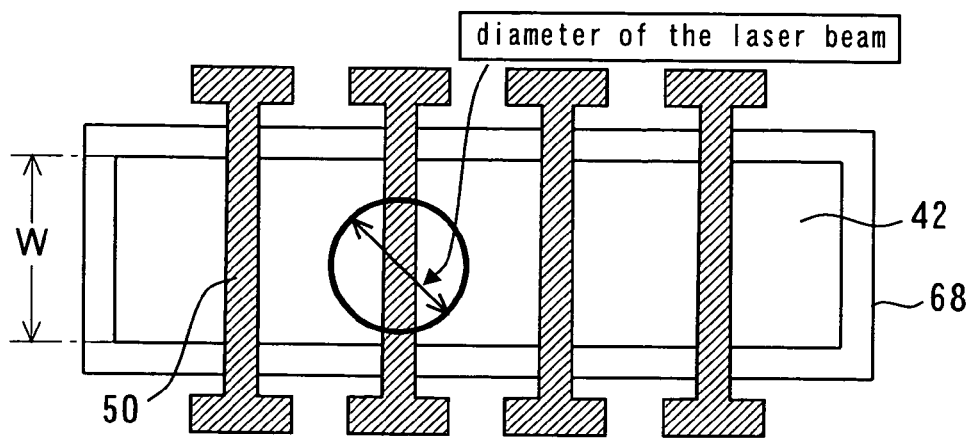
FIGS. 2 to 4 are plan views illustrating the positional relationship between the fuses and the reflector layer according to the first embodiment of the present invention.
Figure 3:
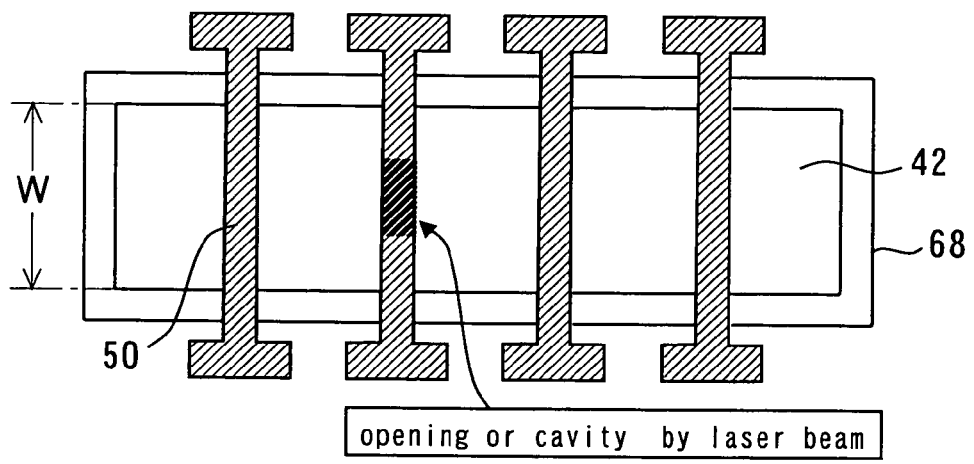
Figure 4:
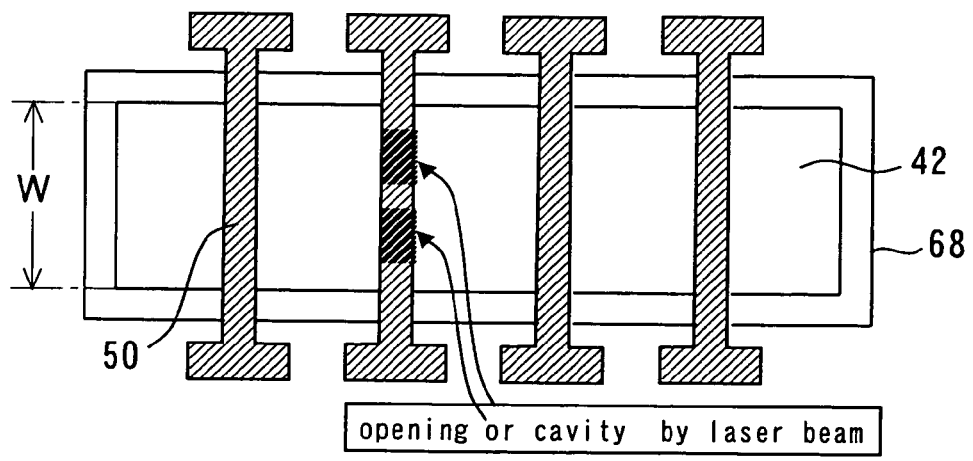

FIGS. 2 to 4 are plan views illustrating the positional relationship between the fuses 50 and the reflector layer 42 according to the first embodiment. Specifically, these figures only show the fuses 50 and the reflector layer 42 as viewed from the top surface of the semiconductor device. According to the present embodiment, the width W of the reflector layer 42 in the semiconductor device must satisfy one of first to third requirements below.

First requirement: The width W of the Cu reflector layer 42 is larger than the diameter of the laser beam applied when a fuse 50 is blown plus a margin of safety (corresponding to the positional tolerance). Cu absorbs substantially no light but the barrier metals 42b and 42e have the property of absorbing light. Therefore, if the width W of the reflector layer 42 is reduced to be equal to the diameter of the laser beam, the sides of the Cu reflector layer 42 are irradiated with the diffracted light, which might lead to melting or blowing of the reflector layer 42. Therefore, the width W of the reflector layer 42 must be larger than the diameter of the laser beam plus a margin of safety (corresponding to the positional tolerance).

Second requirement: The width W of the Cu reflector layer 42 is larger than the dimension (in the length direction of the fuse 50) of the opening, or cavity, formed as a result of blowing the fuse 50, as shown in FIG. 3. This dimension of the opening is approximately equal to the diameter of the laser beam and hence may be used as a reference to determine the width of the Cu reflector layer 42.

Third requirement: When the fuse 50 is blown at two or more locations, the width W of the Cu reflector layer 42 is set such that the Cu reflector layer 42 accommodates all the openings formed as a result of blowing the fuse 50, as shown in FIG. 4. That is, the width W of the Cu reflector layer 42 is set larger than the distance between the upper end of the uppermost opening and the lower end of the lowermost opening, as shown in FIG. 4.

Satisfying one of the above requirements for each fuse 50 allows the openings formed as result of blowing the fuse 50 to be located above the Cu reflector layer 42. As a result, the laser beam can be reflected by the reflector layer 42 when each of the fuses 50 is blown, so that the laser beam does not transmit to the underlying layers.

In the semiconductor device shown in FIG. 1, devices, wires, etc. are formed in the fuse forming regions of the second and first wiring layers below the Cu reflector layer 42. Even when devices are thus formed in wiring layers underlying the Cu reflector layer 42, the laser beam can be reliably reflected by the Cu reflector layer 42, thereby reducing the adverse affect of blowing of a fuse 50 on these devices. Thus, the region under the fuses 50 can be used to form devices, facilitating miniaturization of the semiconductor device.

Figure 5:
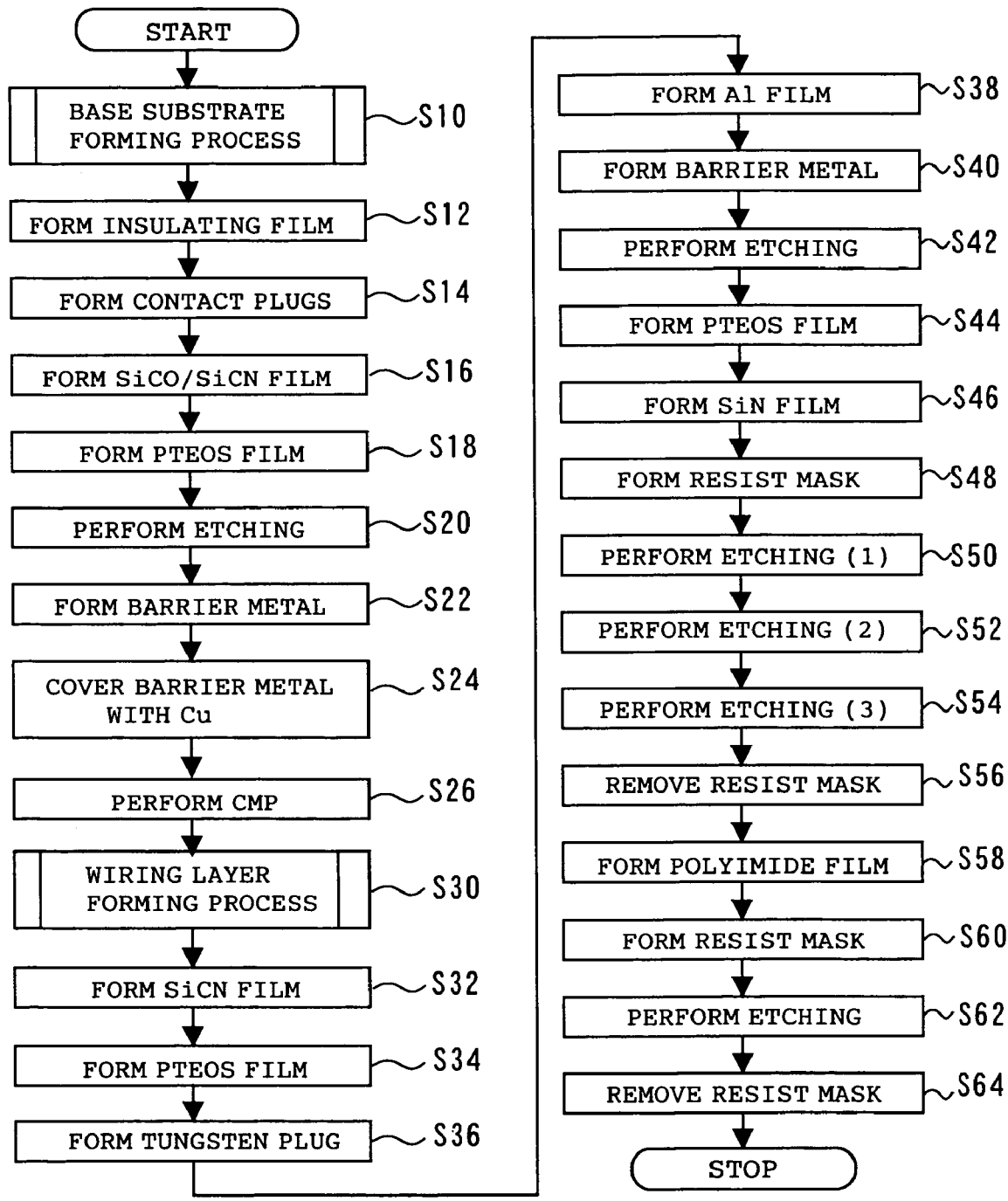
FIGS. 5 to 7 are flowcharts illustrating a method for manufacturing a semiconductor device according to the first embodiment of the present invention.
Figure 6:
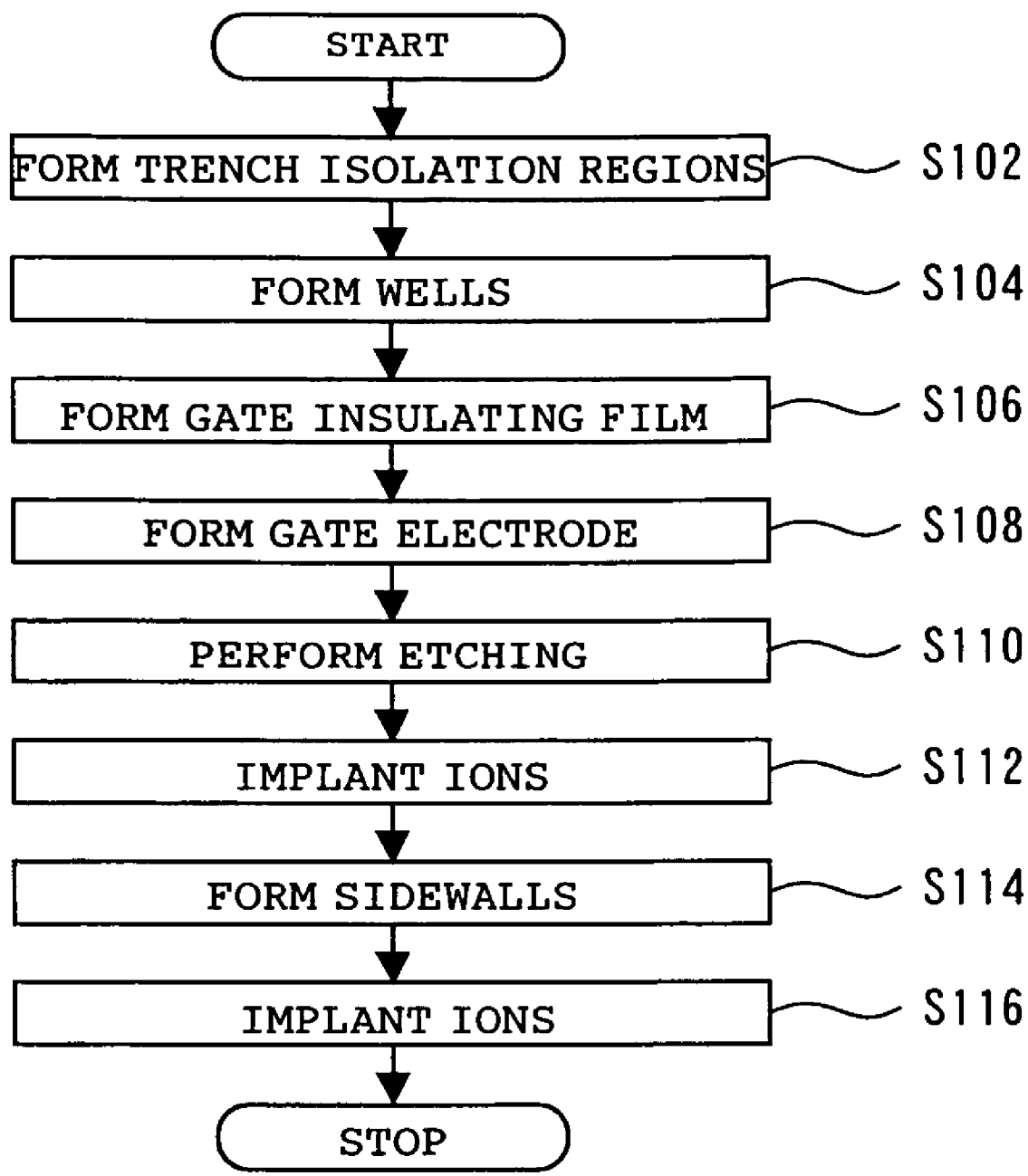
Figure 7:
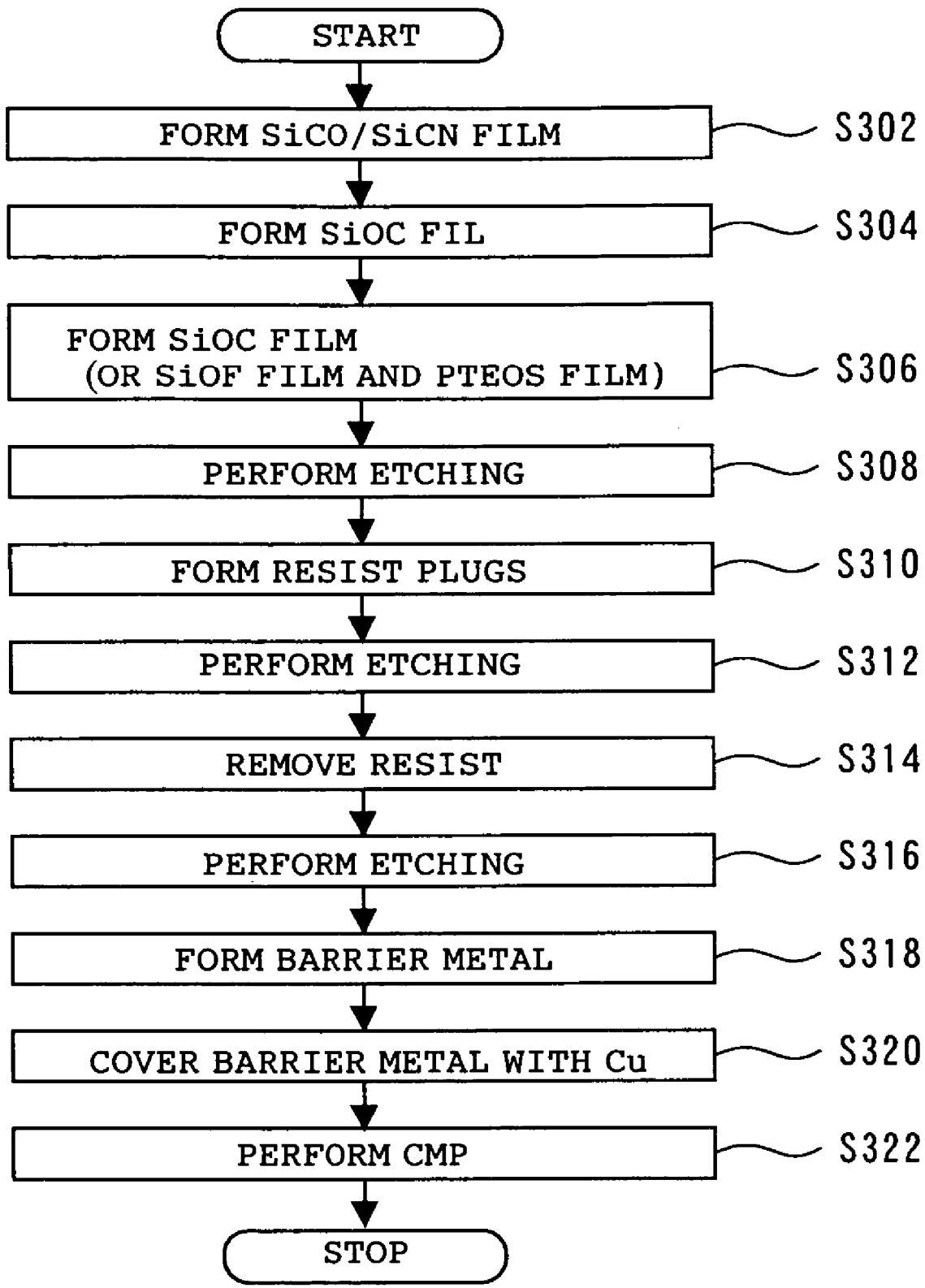
Figure 8:
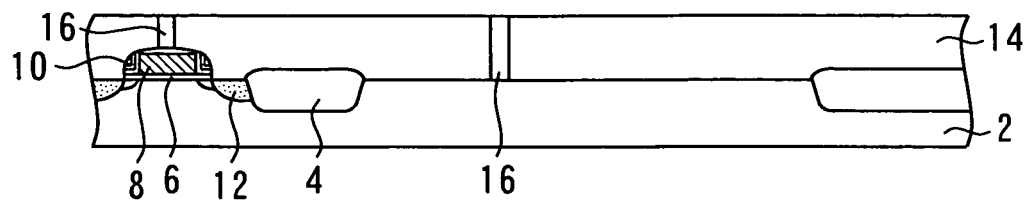
FIGS. 8 to 20 are schematic diagrams illustrating each step in a process for manufacturing the semiconductor device according to the first embodiment of the present invention.

FIGS. 5 to 7 are flowcharts illustrating a method for manufacturing a semiconductor device according to the first embodiment of the present invention. FIGS. 8 to 20 are schematic diagrams illustrating each step in a process for manufacturing the semiconductor device according to the present embodiment. First, in the base substrate forming process at step S10 shown in FIG. 5, foundation layers for transistors, etc. are formed on an Si substrate 2, as shown in FIG. 8. Specifically, in the manufacturing process flow shown in FIG. 6, trench isolation regions 4 are formed in the Si substrate 2 at step S102 and wells (not shown) are formed at step S104.

Then, a material film (used to form a gate insulating film 6) is formed on the Si substrate 2 at step S106. (The gate insulating film 6 is formed by a known technique selected based on the type of insulating film used.) Then, another material film (used to form a gate electrode 8) is formed on the gate insulating film 6 at step S108. (The gate electrode 8 is also formed by a known technique selected depending on the type of material used.) After that, the second material film (for forming the gate electrode 8) is etched into a predetermined shape at step S110, thereby forming the gate electrode 8. Then, at step S112, impurities are implanted into the Si substrate 2 using the gate electrode 8 as a mask to form extension regions. Then, sidewalls 10 are formed on the sides of the gate electrode 8 at step S114. Specifically, the sidewalls 10 are formed by covering the gate electrode 8 with a necessary insulating film and then etching back this insulating film by anisotropic etching. Then, impurities are implanted using the sidewalls 10 and the gate electrode 8 as masks at step S116, forming an impurity diffusion layer 12 including source, drain, and extension regions.

Then, at step S12 in the process flow shown in FIG. 5, a PTEOS film 14 is formed to cover the gate electrode 8, etc. Specifically, the PTEOS film 14 is formed by p-CVD using TEOS. Then, at step S14, contact plugs 16 are formed so as to penetrate the PTEOS film 14 at predetermined positions. Specifically, the contact plugs 16 are formed by forming openings penetrating through the PTEOS film 14 at predetermined positions, then filling these openings with a barrier metal and a Cu layer, and planarizing the surface by CMP.

Figure 9:
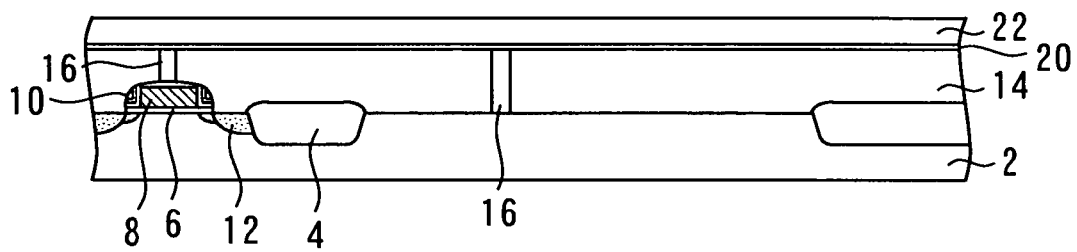
Figure 10:
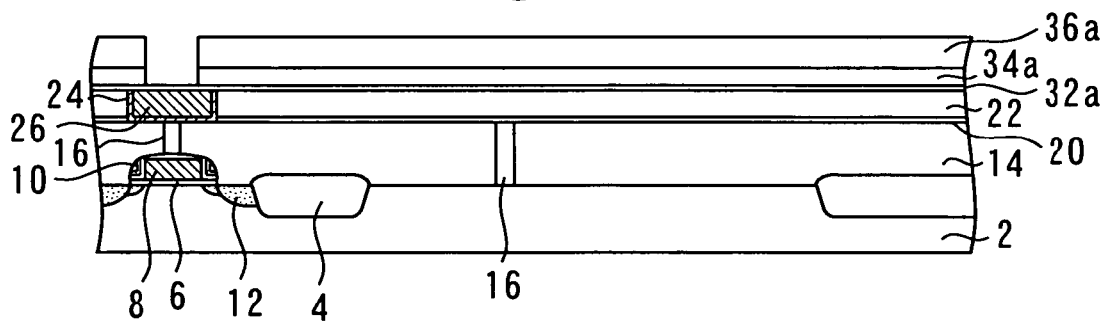

Then, referring to FIG. 9, a first wiring layer is formed on the PTEOS layer 14. Specifically, first an SiCO/SiCN film 20 is formed on the PTEOS film 14 at step S16. After that, a PTEOS film 22 is formed on the SiCO/SiCN film 20 at step S18. As with the PTEOS film 14, the PTEOS film 22 is formed by p-CVD using TEOS. Then, at step S20, in the PTEOS film 22, an opening is formed where a wire is to be formed. Then, at step S22, a barrier metal 24 is formed on the entire surface including the inner walls of the opening formed in the PTEOS film 22. After that, a Cu layer 26 is formed on the surface of the barrier metal 24 at step S24 such that at least the opening formed in the PTEOS film 22 is filled and covered with the barrier metal 24 and the Cu layer 26. After that, the portions of the barrier metal 24 and the Cu layer 26 deposited on the surface of the PTEOS film 22 are removed by CMP at step S26 since these portions are not necessary, thereby forming the wire in the PTEOS film 22. This completes formation of the first wiring layer on the PTEOS film 14.

Then, a second wiring layer is formed on the PTEOS film 22 at step S30. The second wiring layer forming process flow is shown in FIG. 7. Specifically, referring to FIG. 10, first an SiCO/SiCN film 32a is formed on the PTEOS film 22 at step S302, an SiOC film 34a is formed on the SiCO/SiCN film 32a at step 304, and an SiOC film 36a is formed on the SiOC film 34a at step S306. Then, the SiOC film 36a and the SiOC film 34a are etched at step S308. In this etching process, an opening (for the via for wires 38a and 40a) is formed which penetrates the SiOC film 36a and the SiOC film 34a. Specifically, this opening is formed by forming a resist mask having an opening at a predetermined position on the SiOC film 36a by a lithographic technique and etching the SiOC film 36a and the SiOC film 34a using this resist mask. It should be noted that the etching selectivity ratio of the SiOC film 34a to the SiCO/SiCN film 32a is set high enough that the etching reliably stops when the SiCO/SiCN film 32a has been reached.

Figure 11:
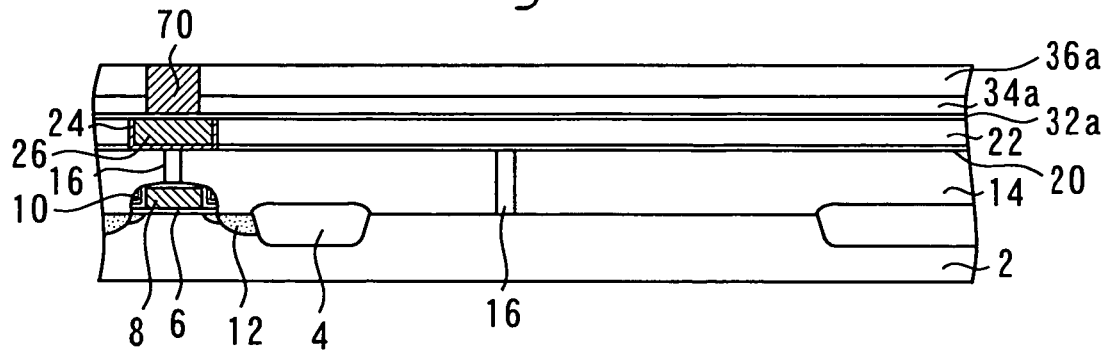

Then, referring to FIG. 11, the opening formed in the SiOC film 36a and the SiOC film 34a is filled with a resist at step S310, forming a resist plug 70.

Figure 12:
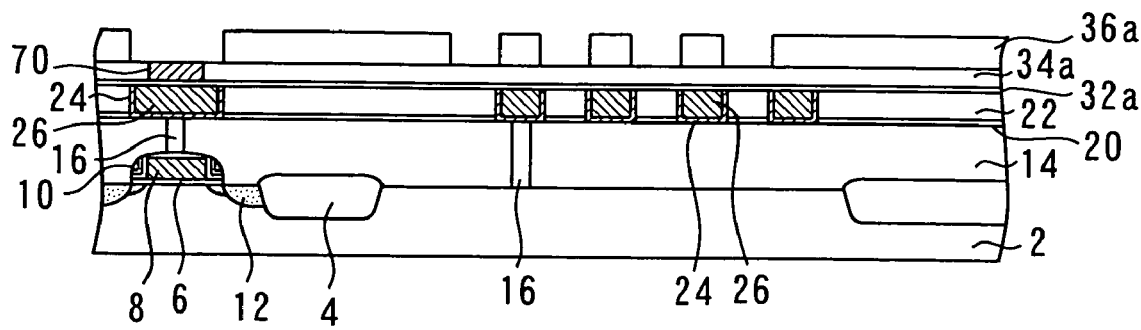

Then, referring to FIG. 12, at step S312, openings are formed at the positions in the SiOC film 36a where wires are to be formed. Specifically, a resist mask is formed on the SiOC film 36a and then the SiOC film 36a is etched using this mask to provide openings for forming wires 38a and 40a in the SiOC film 36a.

Figure 13:
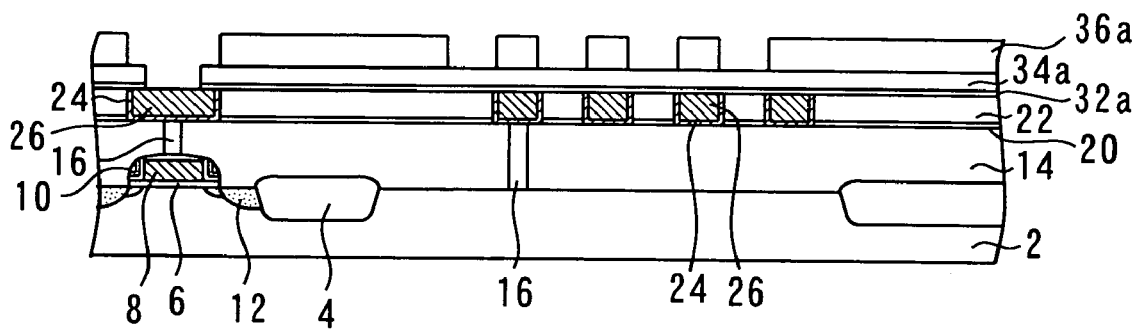

Then, referring to FIG. 13, the resist mask on the SiOC film 36a and the resist plug 70 buried in the SiOC film 34a are removed at step S314. After that, the portion of the SiCO/SiCN film 32a exposed at the bottom of the opening (in the wiring region) is removed by etching at step S316.

Figure 14:
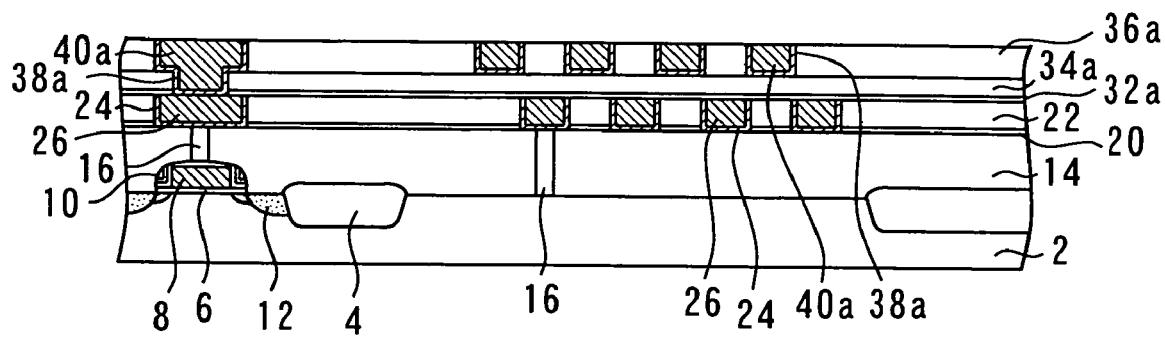
Figure 15:
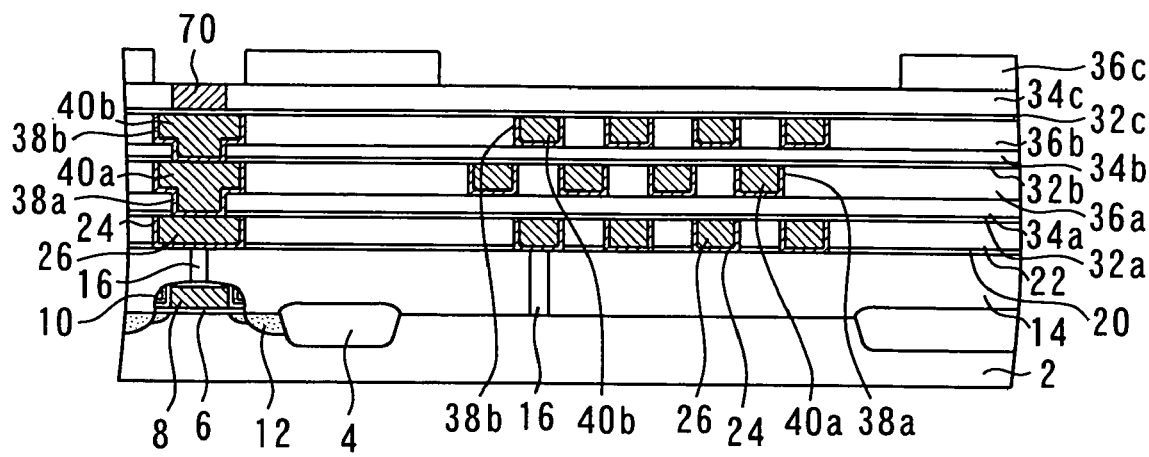

Then, referring to FIG. 14, at step S318, a barrier metal 38a is formed on the entire surface including the inner walls of the openings formed in the second wiring layer. The barrier metal 38a is formed by a sputtering technique. Then, a Cu layer 40a is formed on the barrier metal 38a at step S320. Specifically, the Cu layer 40a is formed by forming a Cu seed film and then turning it into a desired thickness by Cu plating. Then, the portions of the Cu layer 40a and the barrier metal 38a on the SiOC film 36a are removed at step S322 since these portions are not necessary. This completes formation of two types of wires in the second wiring layer: a wire having a dual damascene structure and wires provided under the fuse forming region.

Figure 16:
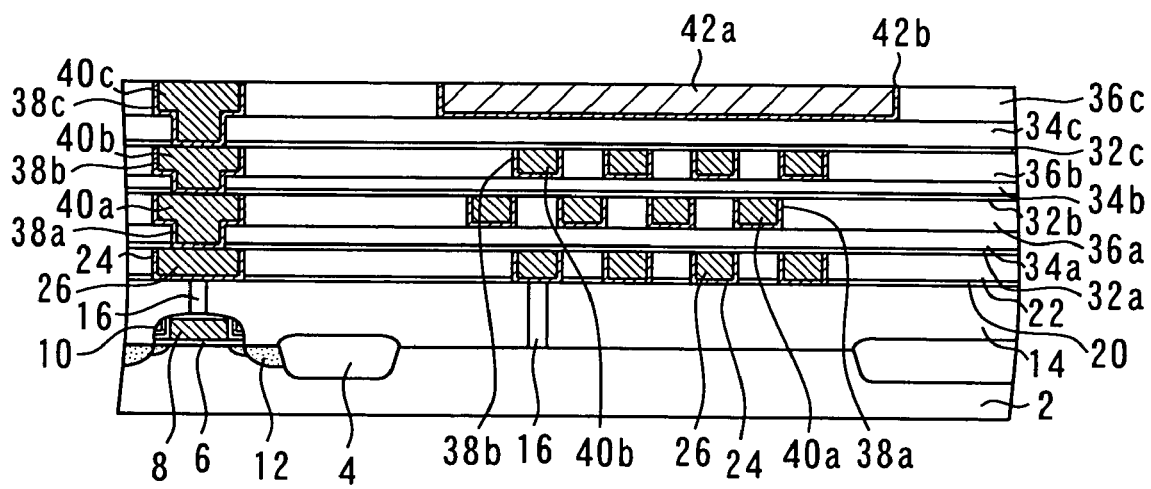

Then, step S30 shown in FIG. 5, that is, the wiring layer forming process (steps S302 to S322) shown in FIG. 7 is repeated to form third to fifth wiring layers. In the process of forming each wiring layer, Cu wires (38b-d, 40b-d) are formed at predetermined locations. When the fourth wiring layer is formed, a lower Cu reflector layer 42a is formed in the fuse forming region at the same time when those wires are formed in the wiring region. Likewise, when the fifth wiring layer is formed, a Cu reflector connection layer 42c and an upper Cu reflector layer 42d are formed in the fuse forming region at the same time when those wires are formed in the wiring region. Specifically, in the processes of forming the fourth and fifth wiring layers, the opening formed in the fuse forming region at step S308 or S312 is larger than those formed when the first and second wiring layers are formed. These openings formed in the fuse forming regions of the fourth and fifth wiring layers are used to form the Cu reflector layer 42. For example, when the fourth wiring layer is formed, a large opening is formed in the fuse forming region of the SiOC film 36c at step S312. After forming this opening, steps S314 to S322 are performed to form the Cu reflector layer 42a while at the same time forming wires in the wiring region, as shown in FIG. 16.

Figure 17:
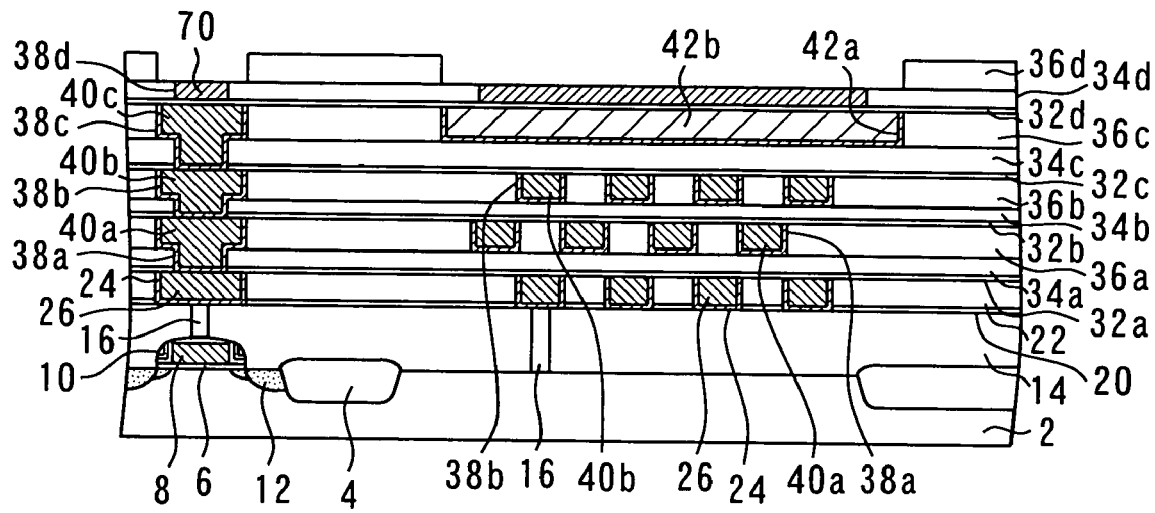

Further, when the fifth wiring layer is formed, at step S308 the SiOC film 34d and the SiOC film 36d are etched so as to form a wide opening (for forming the Cu reflector connection layer 42c) in the SiOC film 34d and in the SiOC film 36d while at the same time forming an opening in the wiring region. After that, these openings are filled with a resist to form resist plugs 70 at step S310. Then, at step S312, the SiOC film 36d is etched as shown in FIG. 17. In this etching process, an opening (for forming the upper Cu reflector layer 42d) wider than the wires in the wiring region is formed in the fuse forming region of the SiOC film 36d. After that, steps S314 to S322 are performed to form the Cu reflector connection layer 42c and the upper Cu reflector layer 42d at the same time.

Also when the sixth wiring layer is formed, steps S302 to S322 are performed. In this case, an SiOF film 36e and a PTEOS film 36f are formed at step S306 instead of an SiOC film. Further, the PTEOS film 36f, the SiOC film 36e, and the SiOC film 34e are simultaneously etched at step S308, and the PTEOS film 36f and the SiOC film 36e are simultaneously further etched at step S312. This allows forming the fuses 50 in the PTEOS film 36f and the SiOF film 36e while at the same time forming wires 38e and 40e.

Figure 18:
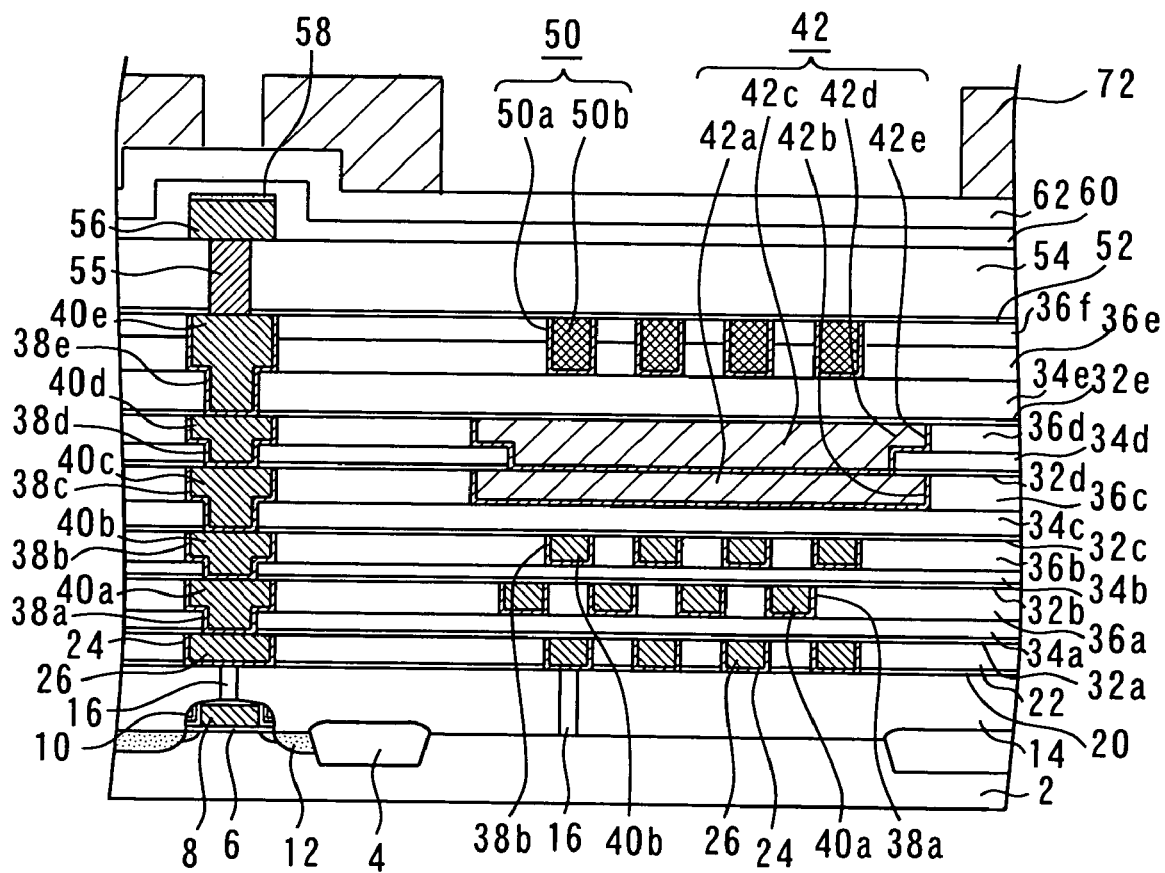

Then, referring to FIG. 18, at step S32 in the process flow shown in FIG. 5, an SiCN film 52 is formed on the PTEOS film 36f. After that, a PTEOS film 54 is formed on the SiCN film 52 at step S34. At step S36, a tungsten plug 55 is formed in the PTEOS film 54 by lithographic and etching processes to connect between the Al pad 56 and the wire made up of the barrier metal 38e and the Cu layer 40e. Then, an Al film (used to form the Al pad 56) is formed on the wiring region of the PTEOS film 54 at step S38. After that, a barrier metal film (used to form a barrier metal 58) is formed on the Al film at step S40. Then, the Al film and the barrier metal film are etched at step 42, completing formation of the Al pad 56 whose surface is protected by the barrier metal 58.

Then, at step S44, a PTEOS film 60 is formed on the PTEOS film 54 such that the Al pad 56 is buried under the PTEOS film 60. Further, an SiN film 62 is formed on the PTEOS film 60 at step S46. Then, a resist mask 72 having openings at the positions corresponding to the openings 66 and 68 is formed on the Al pad 56 and the fuse forming region at step S48.

Figure 19:
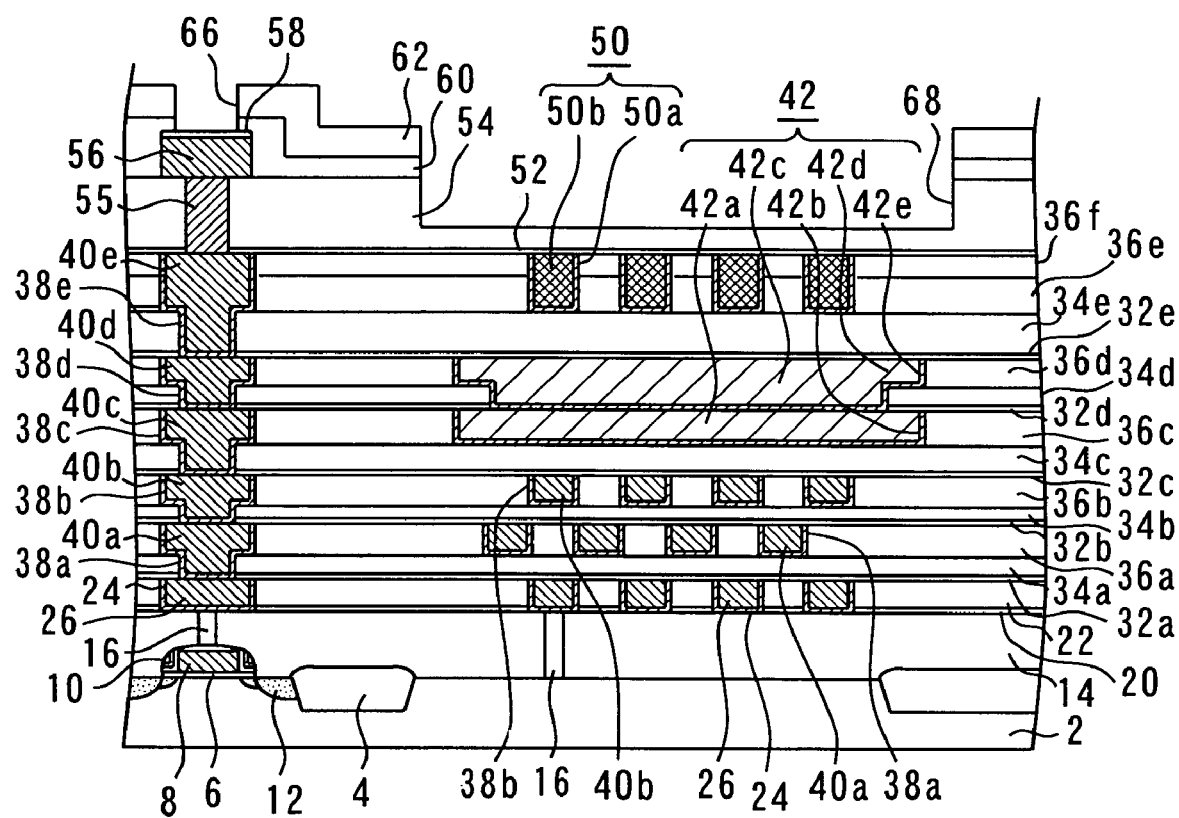

Then, referring to FIG. 19, etching is performed using the resist mask 72 at step S50. This etching process forms an opening on the barrier metal 58 that penetrates through the SiN film 62 and the PTEOS film 60, as well as forming an opening on the fuse forming region that penetrates through the SiN film 62 and the PTEOS film 60 and halfway through the PTEOS film 54.

Figure 20:
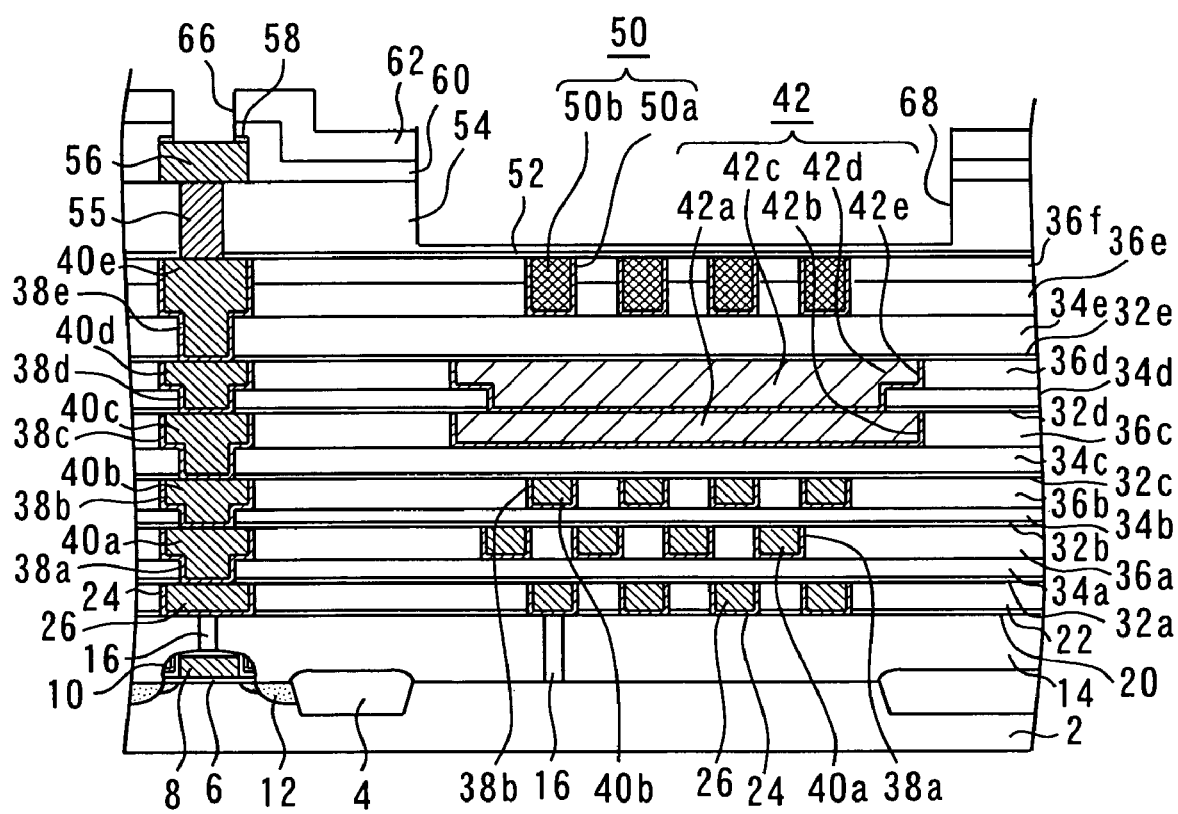

Then, referring to FIG. 20, etching is performed again at step S52. This etching process removes the exposed portion of the barrier metal 58 on the Al pad 56. Further, the portion of the PTEOS film 54 left on the bottom of the opening formed in the fuse forming region is removed at step S54. Specifically, this portion of the PTEOS film 54 is removed by etching using $C_5F_8/O_2/Ar$ as an etching gas. Use of this gas allows the etching selectivity ratio of the PTEOS film 54 to the SiCN film 52 to be set high, so that the etching can be stopped when the SiCN film 52 has been reached. Then, the resist mask 72 is removed at step S56.

Then, a polyimide film 64 is formed on the entire surface at step S58. After that, a resist mask having openings at the positions corresponding to the openings 66 and 68 on the Al pad 56 and on the fuse forming region, respectively, is formed at step S60. Then, the portions of the polyimide film in the openings 66 and 68 are removed using the resist mask at step S62. Then, the resist mask is removed at step S64. As a result, only the SiCN film 52 remains at the bottom of the opening 68 on the fuse forming region side, as shown in FIG. 1; that is, only this single film exists above the fuses 50.

Thus, according to the present embodiment, only a single insulating film is formed above the fuses 50 instead of a plurality of insulating films, or a film stack. Therefore, the present embodiment can provide a smaller insulating film thickness above the fuses 50 than conventional arrangements in which an insulating film stack is provided above the fuses 50. Furthermore, the variation in the thickness of a single insulating film (such as the SiCN film 52) is smaller than the variation in the thickness of a film stack, as described above. Further, the insulating films overlying the Cu reflector layer 42 and the fuses 50 are formed while at the same time forming wires in the wiring region, allowing this semiconductor device to be manufactured without increasing the number of processes.

It should be noted that the present invention is not limited to the shapes of the gate electrode 8 and the wires, or their connection states, described in connection with the present embodiment. The present embodiment has been described with reference to schematic cross-sectional views of a semiconductor device in which the entire device is divided into two types of regions: fuse forming regions and normal wiring regions. However, the present embodiment may be applied to a semiconductor device having a different configuration, in which case the fuse forming regions and wiring regions and their connection states may vary depending on the functions, etc. of the device.

Further, the present embodiment has been described with reference to an example in which wires are formed by a dual damascene technique. However, the wires, the Cu reflector layer 42, and the fuses 50 may be formed by a different method than described in connection with the present embodiment. The forming method may be determined depending on the type of material of which these components are formed.

Further, the present embodiment has been described with reference to an example in which the second to sixth wiring layers have a laminated structure made up of such insulating films as an SiCO/SiCN film, an SiCO film, and another SiOC film (or an SiOF film). However, these wiring layers may be formed of other types of insulating films. Further, other layers of the present embodiment may also include different types of insulating films than described above. However, the insulating film overlying the fuses 50 is preferably not formed of an oxide film of SiCN or SiCO/SiCN, etc., taking into account film thickness controllability and protective functionality.

Figure 21:
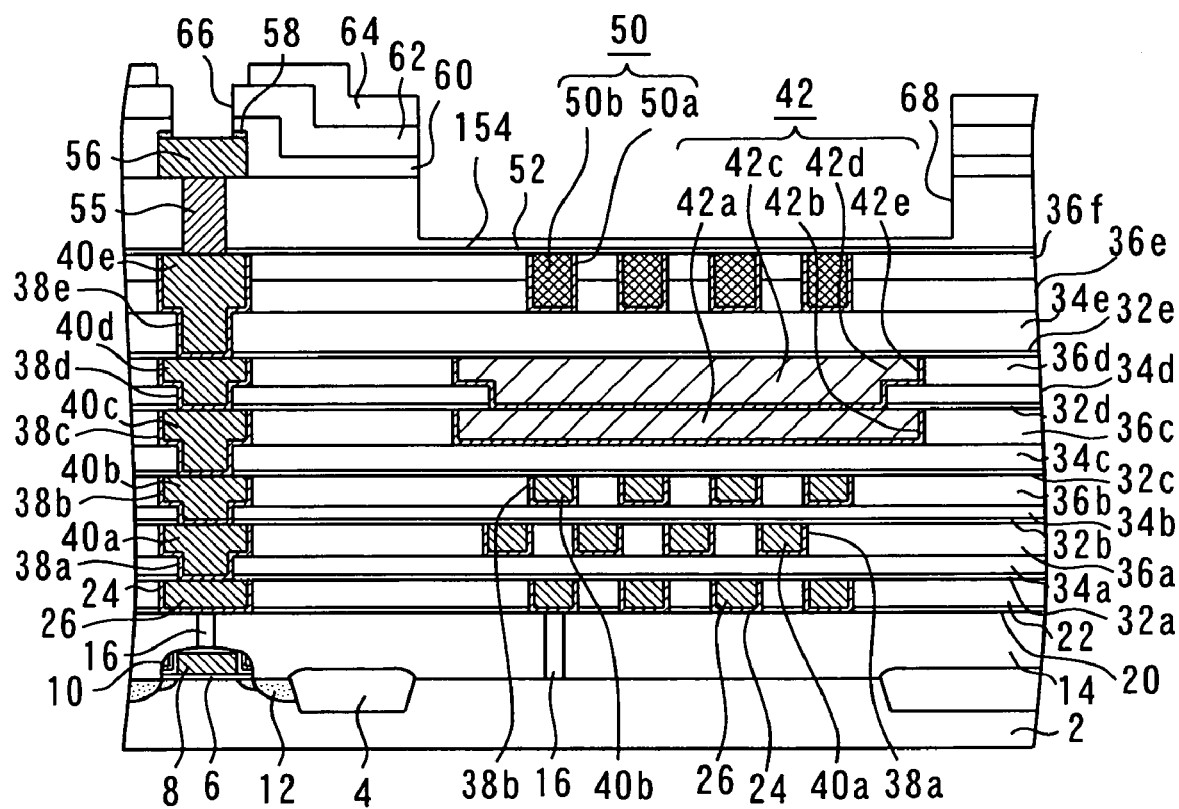
FIG. 21 is a schematic diagram illustrating another exemplary semiconductor device according to the first embodiment of the present invention.

FIG. 21 is a schematic diagram illustrating another exemplary semiconductor device according to the present embodiment. The semiconductor device shown in FIG. 21 is different from that shown in FIG. 1 in that the portion of the PTEOS film 54 formed on the SiCN film 52 above the fuses 50 is not completely removed but is etched to a small thickness at step S56, as shown in FIG. 21. Since this portion of the PTEOS film 54 is thin, its thickness varies only slightly. Therefore, the variation in the thickness of the film stack (made up of the SiCN film 52 and the PTEOS film 54) on the fuses 50 can be reduced to some degree (as compared to conventional arrangements). Further, since the Cu reflector layer 42 is made up of three or more layers and hence has a large thickness, the devices in the layers under the fuses 50 can be reliably protected by the Cu reflector layer 42 when a fuse 50 is blown, as in the semiconductor device shown in FIG. 1.

Second Embodiment

Figure 22:
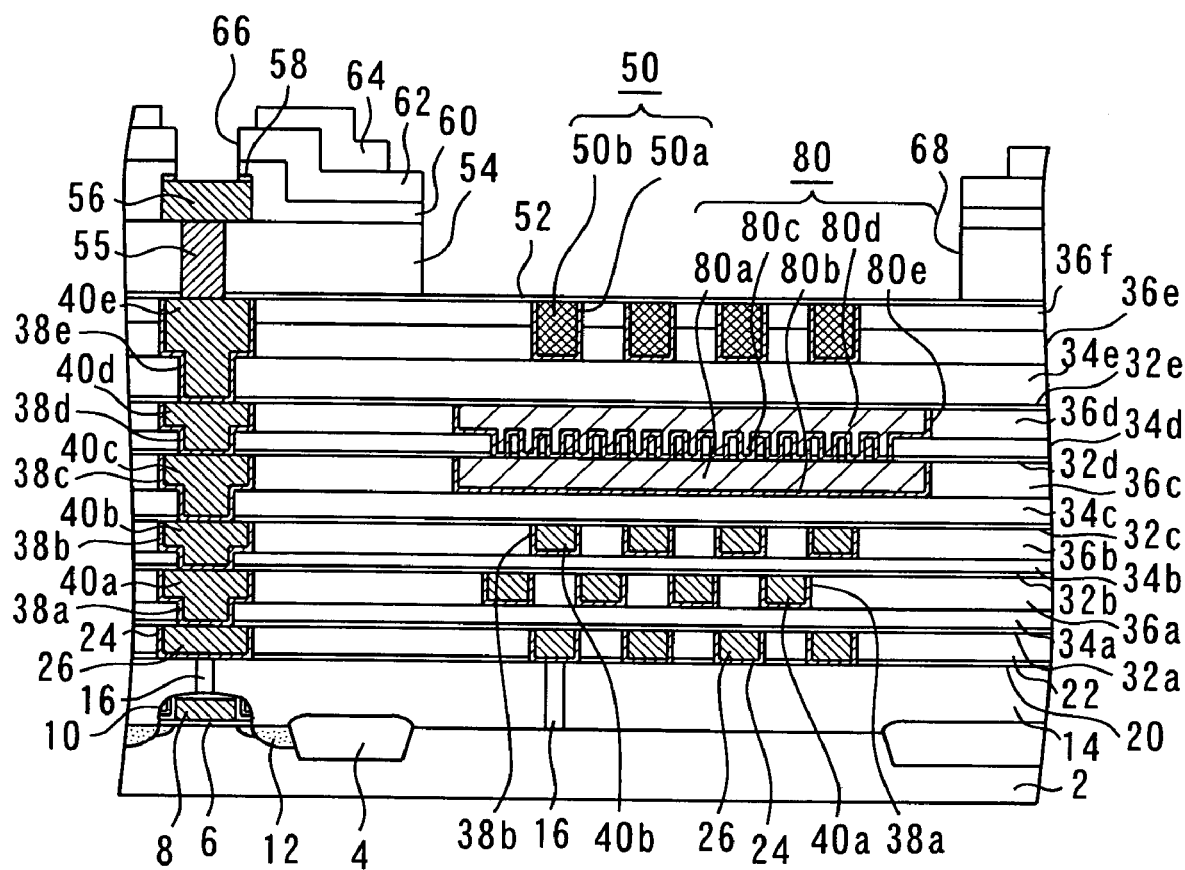
FIG. 22 is a schematic diagram illustrating a semiconductor device according to a second embodiment of the present invention.

FIG. 22 is a schematic diagram illustrating a semiconductor device according to a second embodiment of the present invention. The semiconductor device shown in FIG. 22 is different from that shown in FIG. 1 in that the Cu reflector connection layer has a different shape. Specifically, reflector vias 80c connected between a lower Cu reflector layer 80a and an upper Cu reflector layer 80d in the semiconductor device of FIG. 22 together correspond to the Cu reflector connection layer in the semiconductor device of FIG. 1.

Figure 23:
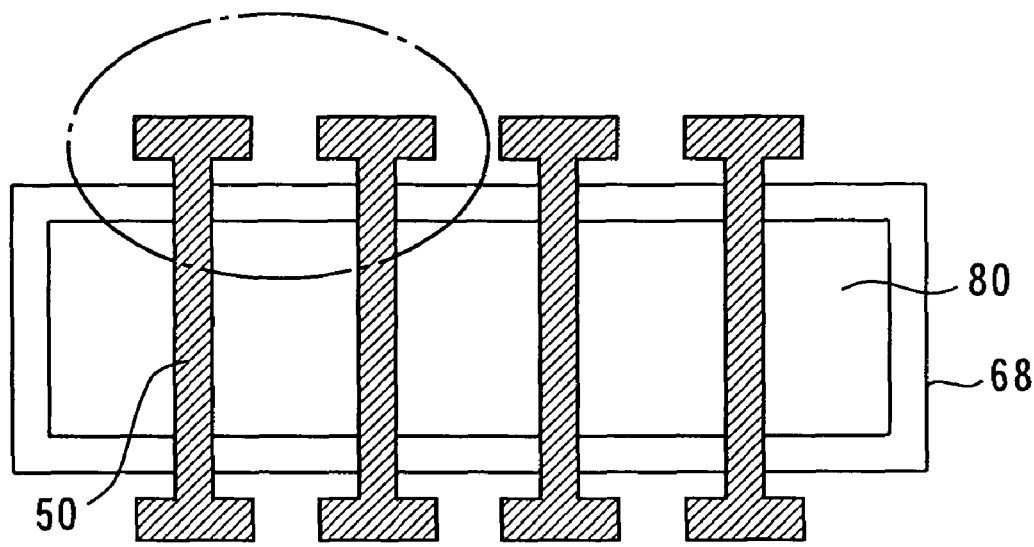
FIG. 23 is a schematic diagram showing fuses and a reflector layer of the semiconductor device according to a second embodiment of the present invention, as viewed from the top surface.
Figure 24:
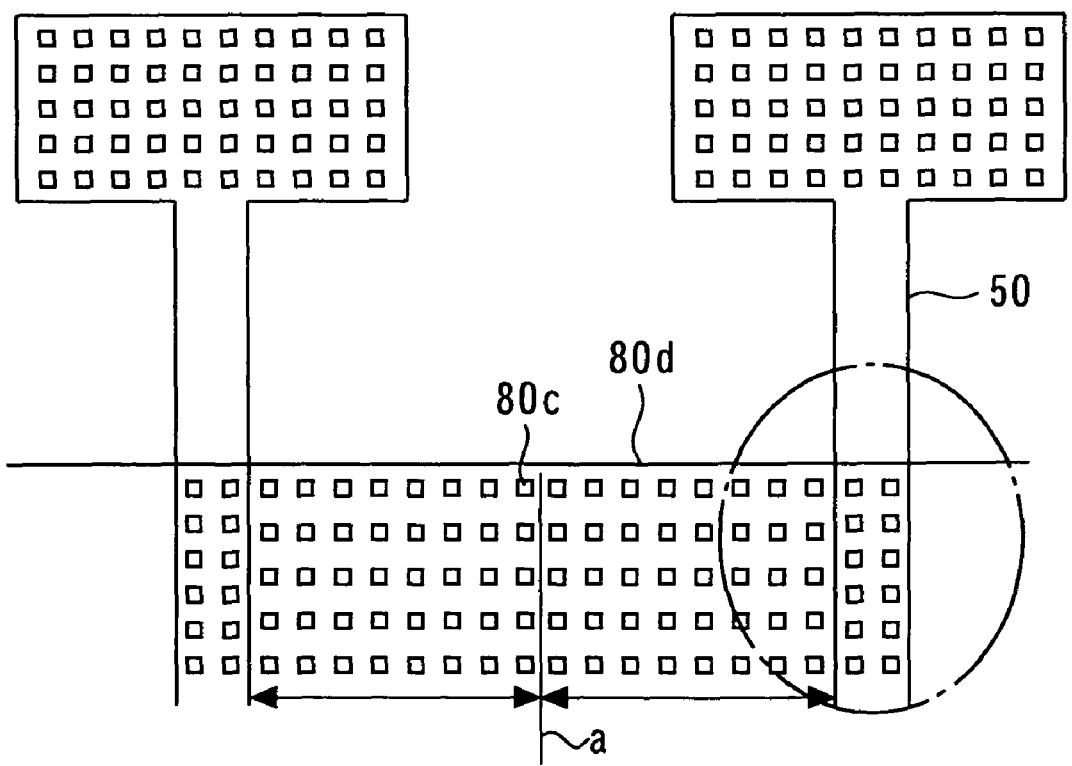
FIG. 24 is an enlarged view of the portion encircled by a dashed line in FIG. 23.

FIG. 23 is a schematic diagram showing fuses 50 and a reflector layer 80 of the semiconductor device of FIG. 22 as viewed from the top surface. FIG. 24 is an enlarged view of the portion encircled by a dashed line in FIG. 23. As shown in FIG. 24, the Cu reflector vias 80c are regularly arranged within the reflector layer 80.

Figure 25:
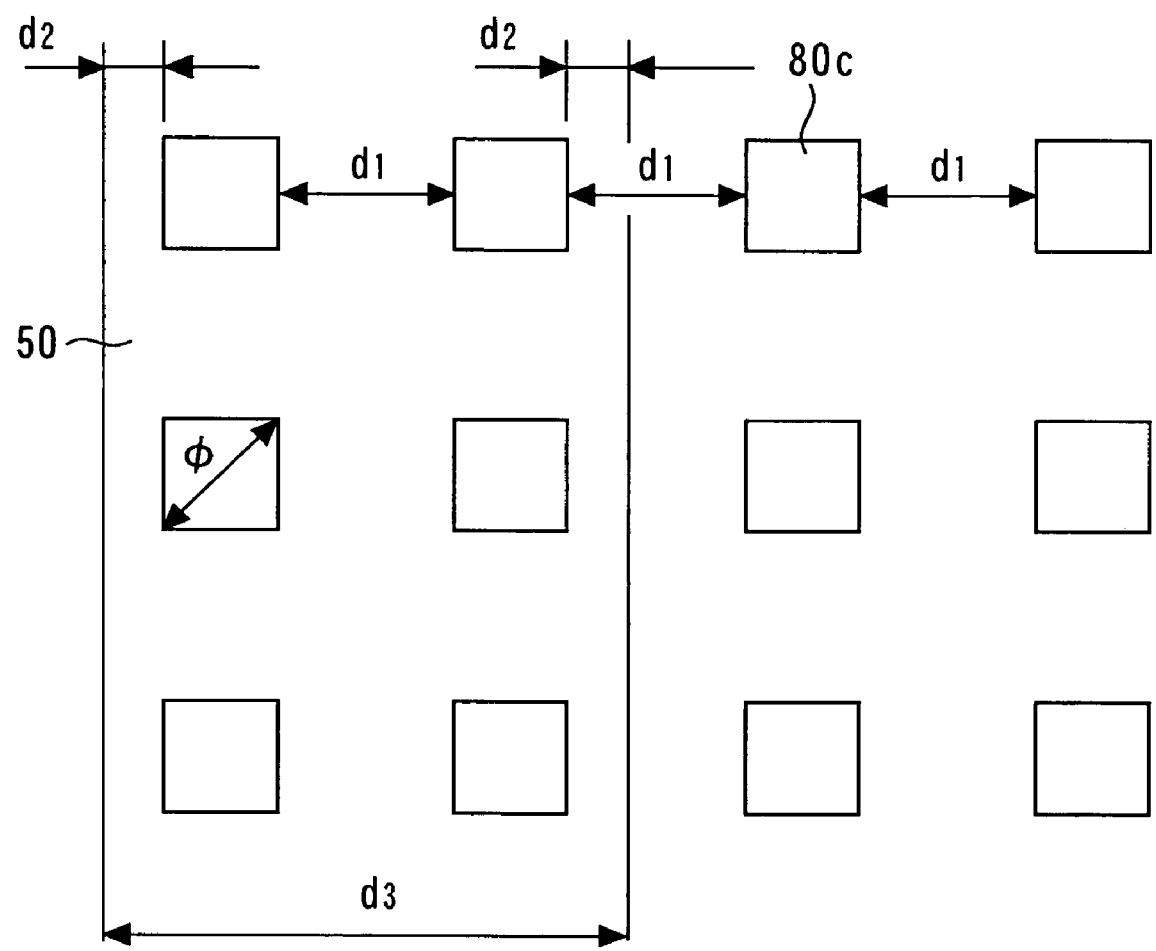
FIG. 25 is an enlarged view of the portion encircled by a dashed line in FIG. 24.

FIG. 25 is an enlarged view of the portion encircled by a dashed line in FIG. 24. All Cu reflector vias 80c (or all via arrangement patterns) located right below the fuses 50 have the same positional relationship with their respective fuses 50. Further, the vias 80c in the Cu reflector layer 80 right below the fuses 50 are regularly arranged (as described above). In the example shown in FIG. 25, the width of the thin portion of each fuse 50 is 0.6 μm. (This thin fuse portion is designed to be cut off by a laser beam.) Further, the diameter of each reflector via 80c is 0.13 μm, and the distance between each two adjacent vias 80c is 0.2 μm. Further, the distance between an edge of each fuse 50 and the nearest via 80c is 0.07 μm.

Referring to FIG. 24, the vias 80c located right below the fuses 50 and many of the other vias 80c have the same size and pitch. That is, the distance between each two adjacent plugs (or vias 80c) is 0.2 μm throughout most of the Cu reflector layer 42. However, an adjustment must be made to the positions of vias 80c in several portions so that all vias 80c (or via arrangement patterns) right below the fuses 50 have the same positional relationship with their respective fuses 50. Specifically, the distance between each two adjacent vias 80c (that sandwich the line a in FIG. 24) in the middle portion between each two adjacent fuses 50 must be adjusted. (As a result, the distance between these vias 80c is different than the distance between other two adjacent vias 80c and hence is not 0.2 μm.) This adjustment is made so that at least the same number of vias 80c are located right below each fuse 50 and they are arranged at equal intervals.

Thus, according to the present embodiment, instead of the Cu reflector connection layer 42c, the Cu reflector vias 80c collectively constitute the Cu reflector connection portion. Forming the Cu reflector connection layer 42c of the first embodiment requires a large opening to be formed. Therefore, in some cases, it is difficult to form such an opening while at the same time forming vias in the wiring region of the same wiring layer, since their sizes are greatly different from each other. To address this problem, the present embodiment arranges Cu reflector vias 80c similar to the vias in the wiring region in a pattern to allow them to be formed at the same time.

When a laser beam applied to blow a fuse has reached the Cu reflector 80, the generated heat in the reflector 80 is predominantly transferred from the upper Cu reflector layer 80d to the lower Cu reflector layer 80a through the Cu reflector vias 80c. As a result, the heat capacity of the portions in the vicinity of the upper Cu reflector layer 80d connected to the Cu reflector vias 80c becomes large and hence these portions are unlikely to melt. On the other hand, the heat capacity of the portions in the vicinity of the upper Cu reflector layer 80d not connected to any of the vias 80c is small and hence these portions are more likely to melt than the portions connected to the vias 80c.

Therefore, if the Cu reflector vias 80c (or via arrangement patterns) right below the fuses 50 have different positional relationships with their respective fuses 50, the Cu reflector 80 melts differently depending on the fuse to which the laser beam is applied. To avoid this problem, the present embodiment arranges the Cu reflector vias 80c such that the vias (or via arrangement patterns) located right below the fuses 50 have the same positional relationship with their respective fuses 50. That is, the arrangement pattern of Cu reflector vias 80c right below each fuse 50 is the same. This allows the Cu reflector 80 to melt to the same degree when each fuse 50 is blown.

The semiconductor device of the present embodiment can be produced by the manufacturing method described in connection with the first embodiment. However, as described above, each film may be formed by a different method than described in connection with the first embodiment.

Further, according to the present embodiment, the arrangement pattern of Cu reflector vias 80c below each fuse 50 may be different than described above. The present embodiment has been described with reference to an example in which the vias 80c (or via arrangement patterns) right below the fuses 50 have the same positional relationship with their respective fuses 50. The reason for this is to allow the Cu reflector 80 to melt to the same degree when each fuse 50 is blown. However, the present invention is not limited to this particular arrangement. The vias 80c (or via arrangement patterns) below the fuses 50 may have slightly different positional relationships with their respective fuses 50 if these vias 80c are uniformly arranged in the layer connected between the upper and lower reflector layers.

Further, in FIGS. 23 to 25, each Cu reflector via 80c is square as viewed from the top. However, it may have a different shape, for example, a round shape. Further, other components of the present invention may also have a different configuration than described above within the scope of the present invention.

It should be noted that in the semiconductor devices of the first and second embodiments, the portion under the first wiring layer that includes the Si substrate 2 and the PTEOS film 14 (which includes a transistor, etc.) corresponds to the substrate described in the appended claims. Further, other components of the present invention correspond to those described in the appended claims, as follows. The first to fifth wiring layers correspond to the wiring layers described in the appended claims; the fuses 50, the fuses; the SiCN film 52, the first insulating film; the PTEOS film 54, the second insulating film; the Cu reflector layer 42, the blocking layer; the SiOC film 36c, the third insulating film; the SiCO/SiCN film 32d and the SiOC film 34d together, the fourth insulating film; the SiOC film 36d, the fifth insulating film; the SiCO/SiCN film 32e and the SiOC film 34e together, the sixth insulating film; the lower Cu reflector layers 42b and 80b, the first blocking layer; the Cu reflector connection layer 42c and the Cu reflector vias 80c, the second blocking layer; and the upper Cu reflector layers 42d and 80d, the third blocking layer.

The features and the advantages of the present invention as described above may be summarized as follows.

According to one aspect of the present invention, the semiconductor device of the present invention is configured such that only a first insulating film made up of a single film is formed above the region irradiated with a laser beam when a fuse is blown, which leads to a stabilized fuse blow.

Obviously many modifications and variations of the present invention are possible in the light of the above teachings. It is therefore to be understood that within the scope of the appended claims the invention may by practiced otherwise than as specifically described.

The entire disclosures of a Japanese Patent Application No. 2005-326629, filed on Nov. 10, 2005 including specifications, claims, drawings and summaries, on which the Convention priorities of the present application are based, are incorporated herein by references in its entirety.

The invention claimed is:

1. A semiconductor device comprising:
   a substrate;

a plurality of wiring layers formed over the substrate and constituting a wiring layer stack;

a fuse formed in a predetermined one of the plurality of wiring layers;

wherein one or more of the plurality of wiring layers together include a blocking layer for reflecting the laser beam used when the fuse is blown, with the one or more of the plurality of wiring layers underlying the predetermined wiring layer in which the fuse is formed, and the blocking layer being located in a region right below the fuse;

a first insulating film made up of a single film containing SiCN and formed on the predetermined wiring layer such that the first insulating film is in contact with a surface of the fuse; and a second insulating film formed on the first insulating film and including a plasma TEOS film and a silicon nitride formed on the plasma TEOS film;

wherein the second insulating film has an opening therein formed above a fuse region of the predetermined wiring layer such that only the first insulating film exists above the fuse region, the fuse region including the fuse and being irradiated with a laser beam when the fuse is blown, and wherein: the wiring layer stack made up of the plurality of wiring layers includes a third insulating film, a fourth insulating film, and a fifth insulating film that are disposed in wiring layers below the fuse, the fourth insulating film being laminated to the third insulating film, and the fifth insulating film being laminated to the fourth insulating film; and the blocking layer includes a first blocking layer, a second blocking layer, and a third blocking layer, the first blocking layer being formed in the third insulating film, the second blocking layer being formed in the fourth insulating film and connected to the first blocking layer, and being made up of a plurality of vias connected between the first blocking layer and the third blocking layer, the third blocking layer being formed in the fifth insulating film and connected to the second blocking layer.

2. The semiconductor device as claimed in claim 1, further comprising a plurality of the fuses; wherein the plurality of vias are arranged such that via arrangement patterns located right below the plurality of fuses have the same positional relationship with their respective fuses.

3. The semiconductor device as claimed in claim 1, wherein the blocking layer has a thickness of 350 nm or more.

4. The semiconductor device as claimed in claim 1, wherein a width of the blocking layer is larger than a diameter of the laser beam plus a margin of safety corresponding to a positional tolerance.

5. The semiconductor device as claimed in claim 1, wherein a width of the blocking layer is larger than a dimension of an opening, or cavity, formed in the first insulating film as a result of blowing the fuse, the dimension extending in a length direction of the fuse.

6. The semiconductor device as claimed in claim 1, wherein when two or more openings, or cavities, are formed in the first insulating film as a result of blowing the fuse, a width of the blocking layer is set larger than a distance between the upper end of the uppermost opening and the lower end of the lowermost opening.

7. The semiconductor device as claimed in claim 1, wherein only a sixth insulating film is provided between the blocking layer and the fuse.

8. The semiconductor device as claimed in claim 1, wherein the wiring layer stack is a copper wiring layer stack, and the predetermined one of the plurality of wiring layers is an uppermost one of the plurality of wiring layers.

9. The semiconductor device as claimed in claim 1, further including a plurality of fuses formed in the predetermined wiring layer, wherein the first blocking layer and the third blocking layer cross the plurality of the fuses in plan view.

* * * * *